US006401545B1

(12) United States Patent
Monk et al.

(10) Patent No.: US 6,401,545 B1
(45) Date of Patent: Jun. 11, 2002

(54) MICRO ELECTRO-MECHANICAL SYSTEM SENSOR WITH SELECTIVE ENCAPSULATION AND METHOD THEREFOR

(75) Inventors: David J. Monk, Mesa, AZ (US); Song Woon Kim; Kyujin Jung, both of Kyunggi-do (KR); Bishnu Gogoi, Scottsdale, AZ (US); Gordon Bitko, Phoenix, AZ (US); Bill McDonald, Scottsdale, AZ (US); Theresa A. Maudie, Phoenix, AZ (US); Dave Mahadevan, Mesa, AZ (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/490,927

(22) Filed: Jan. 25, 2000

(51) Int. Cl.$^7$ .................................................. G01L 7/00
(52) U.S. Cl. ............................. 73/756; 73/715; 73/754; 73/706
(58) Field of Search ............................... 73/715, 146.5, 73/708, 706, 726, 727, 725, 724, 721, 720, 719, 718

(56) References Cited

U.S. PATENT DOCUMENTS

| | | | |
|---|---|---|---|
| 4,802,952 A | 2/1989 | Kobori et al. | 156/634 |
| 4,942,383 A | 7/1990 | Lam et al. | 338/42 |
| 5,207,102 A | 5/1993 | Takahashi et al. | 73/727 |
| 5,333,505 A | 8/1994 | Takahashi et al. | 73/727 |
| 5,583,370 A | * 12/1996 | Higgins, III et al. | 257/667 |
| 5,612,576 A | * 3/1997 | Wilson et al. | 257/788 |
| 5,700,981 A | * 12/1997 | Tuttle et al. | 174/256 |
| 5,894,167 A | * 4/1999 | Moden et al. | 257/679 |
| 5,977,622 A | * 11/1999 | Mertol | 257/687 |
| 5,981,314 A | * 11/1999 | Genn et al. | 438/127 |
| 6,067,709 A | * 3/2000 | Godin et al. | 29/841 |
| 6,071,761 A | * 6/2000 | Jacobs | 438/127 |

OTHER PUBLICATIONS

Adamson, Steven J; Ness Christian Q.; Dam and Fill Encapsulation For Microelectronic Devices; Feb. 21, 1999; Proceedings of the Nepcon West;; National Electronic Packaging and Production Conference–Proceedings of the Technical Program (west and East) v3 pp. 1373–88.*

Carbin J.; Adamson S.; Lewis A R; Gibson D.; Underfill and Encapsulation; May–1999; Asymtek; Advanced Packaging; 8, No. 5 pp. 40–44.*

J.W. Mann; Computer aided, spatially selective protection technique; Jun.–1992; IEE New York, NY; abstract.*

* cited by examiner

Primary Examiner—Benjamin R. Fuller
Assistant Examiner—Andre Allen
(74) Attorney, Agent, or Firm—Rennie William Dover; Miriam Jackson; Mark J. Fink

(57) ABSTRACT

Selective encapsulation of a micro electro-mechanical pressure sensor provides for protection of the wire bands (140) through encapsulation while permitting the pressure sensor diaphragm (121) to be exposed to ambient pressure without encumbrance or obstruction. Selective encapsulation is made possible by the construction of a protective dam (150) around the outer perimeter of a pressure sensor diaphragm (121) to form a wire bond cavity region between the protective dam (150) and the device housing (105). The wire bond cavity may be encapsulated with an encapsulation gel (160) or by a vent cap (170). Alternatively, the protective dam (150) may be formed by a glass frit pattern (152) bonding a cap wafer (151) to a device wafer (125) and then dicing the two-wafer combination into individual dies with protective dams attached.

30 Claims, 3 Drawing Sheets

MICRO ELECTRO-MECHANICAL SYSTEM SENSOR WITH SELECTIVE ENCAPSULATION AND METHOD THEREFOR

FIELD OF THE INVENTION

This invention relates, in general, to Micro Electro-Mechanical System (MEMS) devices and, more particularly, to selective encapsulation in a MEMS device.

BACKGROUND OF THE INVENTION

MEMS sensors, i.e. miniature sensors the size of an integrated circuit, have been introduced into a wide variety of consumer and industrial products that require small devices for sensing a variety of ambient conditions. Perhaps no current application has a greater potential for the incorporation of MEMS pressure sensors than automobile tires. The application requires the embedding of one or more MEMS pressure sensors, equipped with RF transmitters, within an automobile tire. The sensor would monitor tire pressure and transmit a signal providing a low pressure warning to the automobile's processing and display devices, to alert drivers of an unsafe tire.

FIG. 1 illustrates a prior art technique of encapsulation of a MEMS device 10 in which an encapsulation gel 11 is injected into a cavity formed on a plastic package 12 that has a pressure sensor die 13 coupled to plastic package 12 via an adhesive 17. The purpose of encapsulation gel 11 was to protect wire bonds 15 between pressure sensor die 13 and lead frame 14. However, the total encapsulation technique previously used completely covered pressure sensor die 13, including pressure sensor diaphragm 16.

The primary drawback to this prior art total encapsulation gel technique is one of acceleration sensitivity. When encapsulation gel 11 covers pressure sensor diaphragm 16 and MEMS device 10 is placed in a tire that is subject to high revolutions per minute (RPM), the acceleration component realized by such a high RPM will force the mass of encapsulation gel 11 against pressure sensor 13, thereby providing a false tire pressure reading.

Another drawback to the total encapsulation gel technique is known as gel over expansion, commonly referred to as "gel spewing." This phenomenon, caused by rapid changes in ambient pressure, results in the encapsulation gel being spewed or ejected from MEMS device 10. This in turn compromises the integrity of the device leading to contamination and ultimately premature device failure.

Another prior art approach to encapsulation of MEMS pressure sensors was known as conformal coating. This required a thin polymer to be applied over the pressure sensor die, wire bonds and lead frame. While partially solving the acceleration sensitivity problem, conformal coating had its own set of drawbacks.

In harsh environments, moisture would permeate the conformal coating causing delamination and peeling. Once the conformal coating has delaminated to the point of exposing the wire bonds, the MEMS device is subject to premature failure. Also, for parylene C coatings, heat in excess of 105 degrees Celsius (° C) causes an oxidative degradation or other permanent material property change to the coating, thereby further subjecting the conformal coating to the problems of moisture.

Still another prior art encapsulation technique combined the total encapsulation gel with the conformal coating. Yet another technique was to encapsulate the MEMS device with a stainless steel cap or cover. However, these solutions were subject to the problems associated with acceleration sensitivity as well as higher cost.

Another prior art technique for manufacturing pressure sensor units is disclosed by Kobori et al. ("Kobori") in U.S. Pat. No. 4,802,952. Kobori discloses a wafer-level capping technique employing anodic bonding for piezoresistive elements. The disadvantage of Kobori is that the pressure sensitive diaphragms are formed by etching recesses on the underside of the silicon substrate. This technique adds cost and inefficiency to the manufacturing process.

Another prior art packaging technique is disclosed by Lam et al. ("Lam") in U.S. Pat. No. 4,942,383. Lam discloses a pressure sensor package where a die is adhesively coupled to a bottom cover and a top cover is coupled to the bottom cover by ultrasonic welding adhesive. Once again, the sensor diaphragm is located on the underside of the package. Furthermore, there is no preventative measure for precluding seepage of the die adhesive onto the diaphragm.

Still another prior art technique is disclosed in a pair of patents by Takahashi et al. in U.S. Pat. No. 5,207,102 ("Takahashi '102") and 5,333,505 ("Takahashi '505"). In Takahashi '102 a pressure sensor die is located on a top surface of a pedestal and the bottom surface of the pedestal is secured to a die pad. Wire bonding connects the pressure sensor die to leads. The die, wire bonds, pedestal and die pad are encapsulated by a conventional molding process using epoxy resin. Although not disclosed with particularity, it appears from the drawings and specification that Takahashi '102 relies on temporary plugs as part of the molding process to limit the encapsulation of the epoxy resin.

Takahashi '505 discloses an improved version of Takahashi '102 having a resin dam surrounding the periphery of the piezoresistor to prevent a sheathing resin from flowing into the diaphragm during monolithic molding. A close reading of Takahashi '505 reveals that the dam is actually a seal between the pressure sensor die and the molding plug used during epoxy resin encapsulation. The dam/seal helps to prevent the encapsulating resin from seeping onto the diaphragm as was apparently the drawback of Takahashi '102. Takahashi '505 discloses formation of the dam by a printing method or photoengraving. The height of the dam is approximately equal to the bond pads on the pressure sensor die. Note that the height of the molded encapsulation epoxy resin is significantly higher than that of the dam. Thus, the dam disclosed by Takahashi '505 is a misnomer, i.e. it is not a true dam in that it does not create a cavity or reservoir, but rather is a seal to prevent resin seepage during the molding process.

Therefore, a need exists to provide a more reliable, improved quality and more robust encapsulation technique for protecting the integrity of MEMS sensors without incurring the performance handicaps and failure mechanisms of prior art techniques.

DETAILED DESCRIPTION OF THE DRAWINGS

Figure 1:
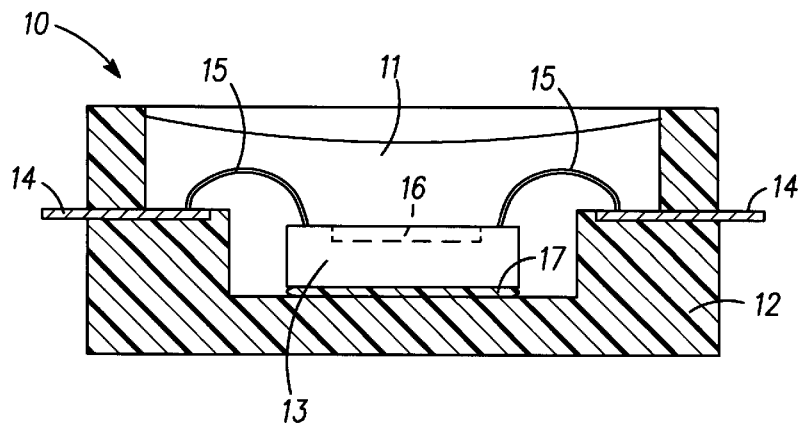
FIG. 1 is a cross sectional side view of a prior art total encapsulation MEMS pressure sensor.
Figure 2:
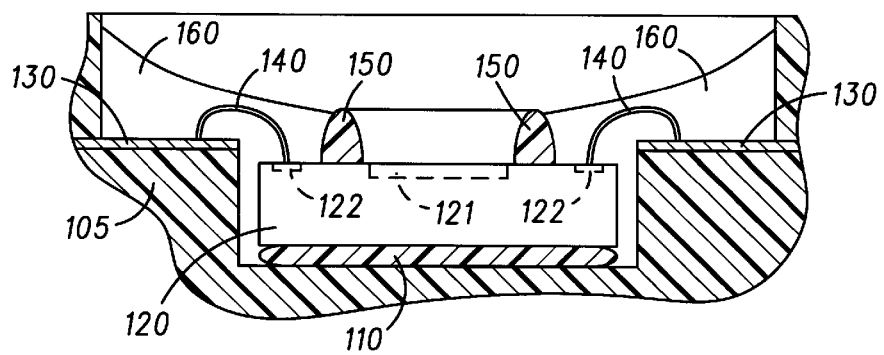
FIG. 2 is a cross sectional side view of a MEMS pressure sensor with selective encapsulation in accordance with a first embodiment of the present invention.

FIG. 2 is a cross-sectional side view of a MEMS sensor 100 with selective encapsulation in accordance with an embodiment of the present invention. MEMS pressure sensor 100 comprises a housing 105 (partially shown) which is typically made of a plastic material. A sensor die 120 is attached to plastic housing 105 by an epoxy or silicone adhesive 110. Wire bonds 140 provide an electrical connection between wire bond pads 122 of sensor die 120 and a lead frame 130. Also shown are a protective dam 150 and an encapsulation gel material 160, which serves as a protectant.

The particulars of the various elements, as well as the technique for fabricating the improved MEMS sensor 100, is as follows. The description of the various embodiments of the present invention is drawn primarily to a MEMS pressure sensor. However, the described embodiments of the present invention of selective encapsulation are applicable to a wide variety of MEMS sensors, including capacitive sensors which sense pressure, chemical, humidity, etc.

The common denominator of these types of MEMS sensors with regard to the various embodiments of the present invention, is a transducer element such as a capacitive diaphragm or membrane which is sensitive to some ambient condition and which, for optimal performance, should be free of encapsulation gel. However, the remainder of the package, other than the transducer element, should be encapsulated for environmental protection.

After a wafer containing numerous MEMS pressure sensor devices is diced into individual dies, each individual pressure sensor die 120 is attached to a housing 105, which is typically made of plastic, by conventional means. Typically an epoxy or silicone adhesive 110 is used to attach pressure sensor die 120 to the base of plastic housing 105.

Subsequent to attaching pressure sensor die 120 to plastic housing 105, wire bonds 140 are connected between die wire bond pads 122 and lead frame 130.

Figure 3:
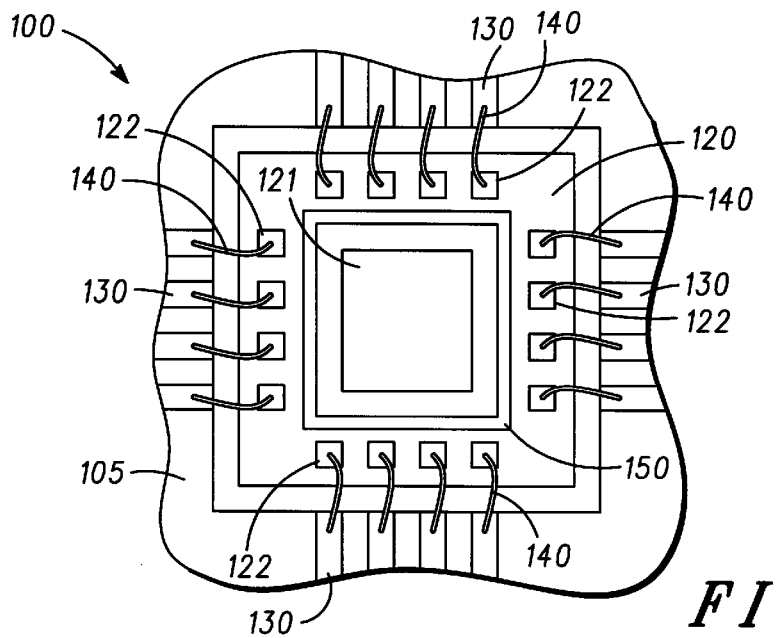
FIG. 3 is a top view of the MEMS device of FIG. 2.

A subsequent step is to construct protective dam 150 between the outer perimeter of a pressure sensor diaphragm 121 and the inner perimeter formed by bond pads 122. Pressure sensor diaphragm 121 is typically located in the center portion of pressure sensor die 120 as shown in FIG. 3. Protective dam 150 is then cured at high temperature.

Following the curing of protective dam 150, MEMS pressure sensor 100 is ready for encapsulation. During this step an encapsulation gel 160 is dispensed into the wire bond cavity region that is located between protective dam 150 and plastic housing 105, thereby covering bond pads 122, portions of lead frame 130 and wire bonds 140. After selective encapsulation is completed, encapsulation gel 160 is cured.

By way of example, protective dam 150 is constructed of a fluorocarbon based material to achieve the best media compatibility, i.e., to protect the integrity of the wire bonds 140 from contamination by foreign matter. However, fluorocarbon type material is also typically the most costly. Other cost effective materials include silicone and fluorosilicone base materials. Typically similar materials are used for both protective dam 150 and encapsulation gel 160.

Protective dam 150 is typically constructed by forming it as a unit using a device such as a dispensing collet. A dispensing collet is a nozzle type device where the design of the output opening of the nozzle corresponds the design of protective dam 150. Thus, for rectangular shaped dams, the dispensing collet would have a rectangular shaped nozzle which would permit the formation of all four walls of the protective dam 150 simultaneously. The current design preferably uses a rectangular shaped protective dam 150 for consistency with the rectangular shaped pressure sensor diaphragm 121. However, other shape diaphragms and protective dams are contemplated including, but not limited to, circular configurations, triangular configuration, pentagonal configurations, or the like.

Alternatively, each of the four walls of protective dam 150 may be formed using a dispensing needle. In the dispensing needle method of protective dam construction, each of the dam walls is formed sequentially, as opposed to the dispensing collet method in which the dam walls are formed simultaneously. The dispensing needle essentially line draws each dam wall. Multiple passes for each wall can be made to control the height and width of protective dam 150.

The minimum height for protective dam 150 is preferably equal to approximately the loop height of wire bonds 140, i.e. the apogee of wire bonds 140 above pressure sensor die 120. The minimum height is driven by the requirement to insure complete encapsulation of wire[]bonds 140. The maximum height of protective dam 150 is that of plastic housing 105. However, in practice the height of protective dam 150 ranges between the apogee of wire bonds 140 and plastic housing 105 as shown in FIG. 2.

For typical applications where the thickness of pressure sensor die 120 is approximately 645 microns ($\mu$m), i.e., approximately 25 mils, and the total cavity height of the plastic housing 105 is approximately 135 mils, the nominal height of the protective dam 150 is in the range of 774–1,548 $\mu$m, i.e., approximately 30–60 mils.

Figure 4:
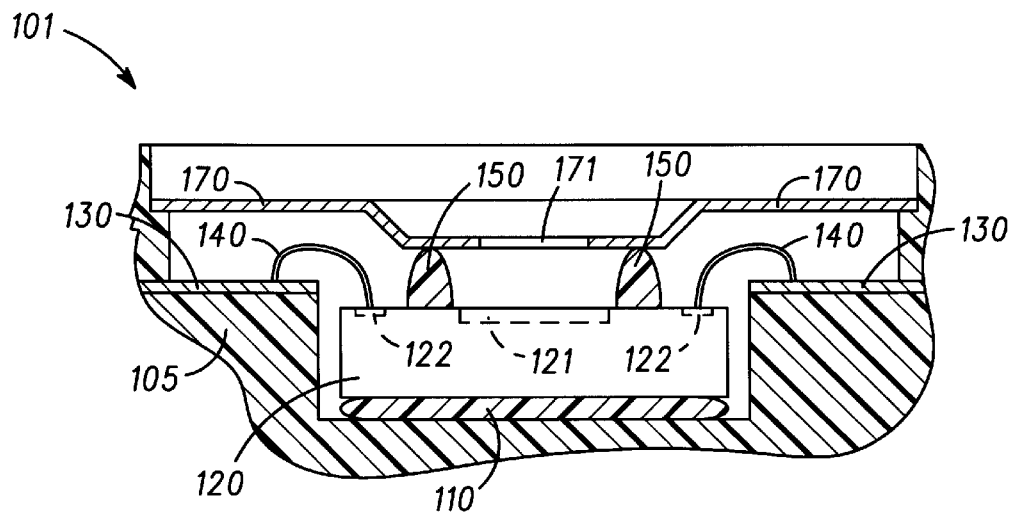
FIG. 4 is a cross sectional side view of a MEMS pressure sensor with selective encapsulation in accordance with a second embodiment of the present invention.
Figure 5:
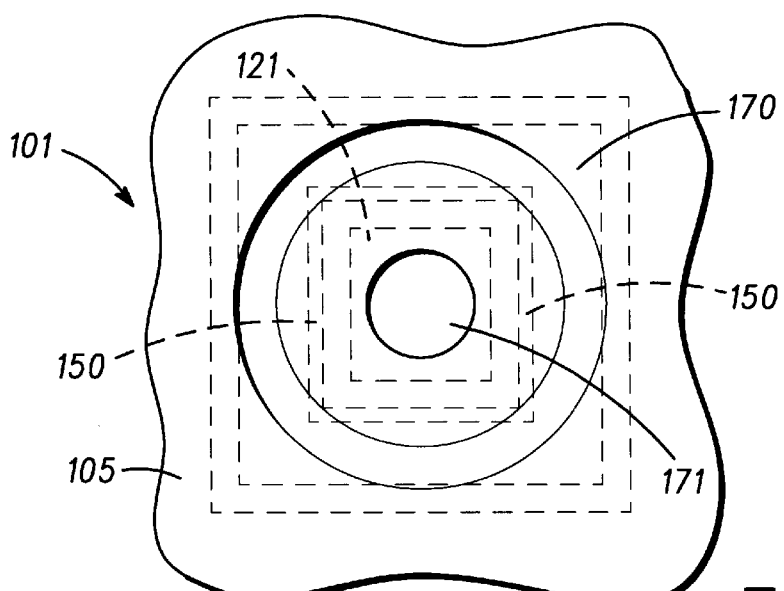
FIG. 5 is a top view of the MEMS device of FIG. 4.

Now referring to FIGS. 4 and 5, MEMS pressure sensor 101 with selective encapsulation 101 in accordance with another embodiment is depicted in which a vent cap 170 serves as a protectant. MEMS pressure sensor 101 includes vent cap 170 covering, sealing or otherwise encapsulating the wire bond cavity region instead using an encapsulation gel to fill the wire bond cavity. Vent cap 170 has a vent aperture 171 in the center which permits pressure sensor diaphragm 121 to receive unmolested ambient pressure. The prior art problem of gel over expansion is avoided by not having to fill the wire bond cavity with encapsulation gel.

Formation MEMS pressure sensor 101 employs similar steps as described for the formation of MEMS pressure sensor 100 including attaching pressure sensor die 120 to plastic housing 105 (partially shown), wire bonds 140 which electrically connect pressure sensor bond pads 122 to lead frame 130, and the construction of protective dam 150.

However, after protective dam 150 has been constructed on a top surface of pressure sensor die 120, vent cap 170 is placed over the device. The outer edges of vent cap 170 mate with plastic housing 105. The lower surface of the center portion of vent cap 170 is pressed down against protective dam 150. Sealing vent cap 170 takes place by curing the device at high temperature. Alternatively, an adhesive material can be used to seal vent cap 170. Also, various combinations of heat curing and adhesive may be employed to seal vent cap 170.

Preferably, vent cap 170 is formed from a plastic material which is compatible with plastic housing 105 and protective dam 150. In alternative embodiments, vent cap 170 may be constructed from metal. However, for a metal embodiment, adequate clearance must be provided between vent cap 170 and wire bonds 140 so as to preclude electrical shorting of wire bonds 140 to vent cap 170. The limitations of the height of protective dam 150 are similar to those described for MEMS sensor 100.

As shown in FIG. 4, vent cap 170 has an offset in the center portion where it contacts protective dam 150. The purpose of the offset is to optimize the height of the protective dam 150 with respect to wire bonds 140 and plastic housing 105. However, alternative embodiments may not need the offset.

Figure 6:
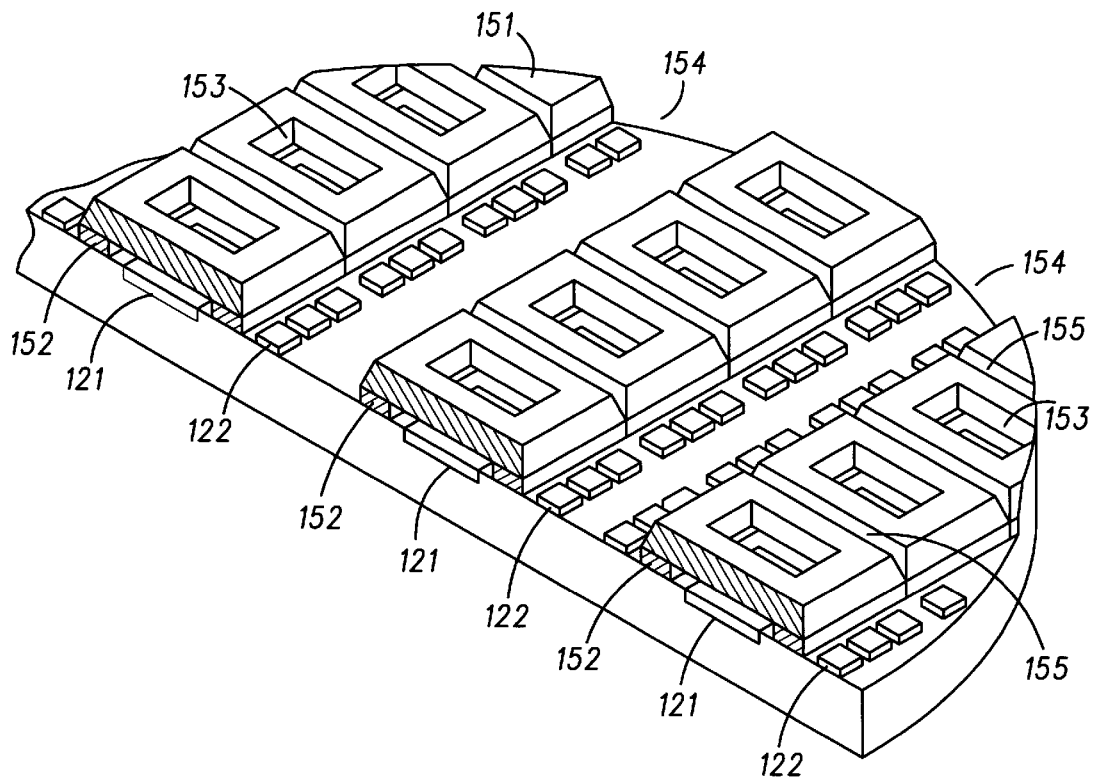
FIG. 6 is a perspective view of a MEMS device in accordance with a third embodiment of the present invention.

Now referring to FIG. 6, a MEMS pressure sensor 102 with selective encapsulation in accordance with yet another embodiment of the present invention is depicted. In this embodiment, protective dam 150 is formed at the wafer level by bonding a cap wafer 151 to a device wafer 125 by means of a glass frit 152 or other suitable adhesive. A preliminary step in the fabrication of MEMS sensor 102 is to form a plurality of sensor devices on a substrate such as device wafer 125. FIG. 6 illustrates diaphragms 121 and wire bond pads 122 of a typical sensor device.

Independent of the sensor device formation on device wafer 125, a second wafer sometimes referred to as a cap wafer 151 is patterned with a plurality of diaphragm apertures 153, device channels 154 and cut lines 155. A subsequent step is to form a bonding area by depositing a glass frit pattern by screen printing or other means on cap wafer 151. Cap wafer 151 is then aligned and bonded to device wafer 125. The cap/device wafer combination is then heat cured and diced into individual pressure sensor dies 120 having a protective dam 150 attached.

Figure 7:
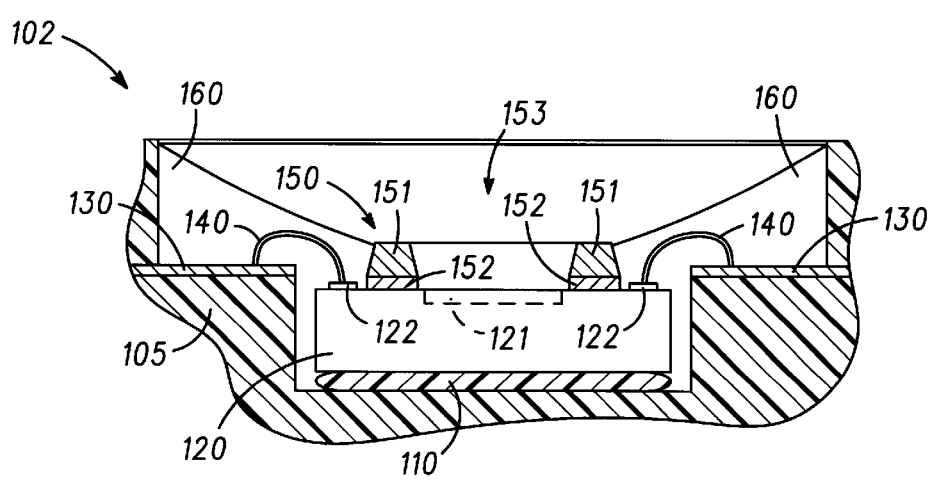
FIG. 7 is a cross sectional view of the MEMS device shown in FIG. 6.

FIG. 7 is a cross sectional view of encapsulated device 102 which further illustrates diaphragm aperture 153. Each of pressure sensor dies 120 is attached to housing 105 as described in previous embodiments. Wire bonding is similarly accomplished by connecting wire bonds 140 between wire bond pads 122 and lead frame 130. A wire bond cavity region is formed between the protective dam 150, i.e., the combination of portions cap wafer 151 and glass frit pattern 152, and housing 105. The wire bond cavity is filled with lo encapsulation gel 160 similar to the previously described embodiments. The limitations of the height of the protective dam 150 are similar to those described with respect to MEMS sensor 100.

By now it should be appreciated that an improved MEMS sensor has been provided that has selective encapsulation which solves problems such as acceleration sensitivity, gel over expansion, and other disadvantages endemic to prior art sensors. Further, the performance in harsh environments of MEMS sensors manufactured in accordance with the present invention is improved. It should be understood the MEMS sensors of the present invention include pressure sensors, chemical sensors, humidity sensors, etc.

Although the invention has been particularly shown and described with reference to a preferred embodiment thereof, it will be understood by those skilled in the art that changes in form and detail may be made therein without departing from the spirit and scope of the invention.

What is claimed is:

1. A micro electro-mechanical sensor, comprising,
a housing;
a lead frame coupled to the housing;
a sensor die having a first surface for attaching the sensor die to the housing, the sensor die comprising a sensor diaphragm for measuring an ambient condition and a plurality of bond pads formed over a second surface of the sensor die;
wire bonds electrically connecting at least one of the plurality of bond pads to the lead frame;
a protective dam constructed on the second-surface of the sensor die outside of a perimeter of the sensor diaphragm; and
a protectant over the wire bonds without encapsulating the sensor diaphragm.

2. The micro electro-mechanical sensor of claim 1, further comprising a cavity formed by the housing and the protective dam, wherein the protectant is an encapsulation gel located in the cavity, wherein the encapsulation gel encapsulates the wire bonds but does not encapsulate the sensor diaphragm.

3. The micro electro-mechanical sensor of claim 1, wherein the protectant is a vent cap coupled to the housing and to the protective dam wherein the vent cap encapsulates the wire bonds and has a vent aperture such that the vent cap does not encapsulate the sensor diaphragm.

4. The micro electro-mechanical sensor of claim 1, wherein the sensor die is a pressure sensor for measuring an ambient pressure.

5. The micro electro-mechanical sensor of claim 1, wherein the sensor die is a chemical sensor for measuring an ambient chemical condition.

6. The micro electro-mechanical sensor of claim 1, wherein the sensor die is a humidity sensor for measuring an ambient humidity.

7. The micro electro-mechanical sensor of claim 1, wherein the sensor die is a capacitive device.

8. The micro electro-mechanical sensor of claim 1, wherein the protective dam is constructed between the perimeter of the sensor diaphragm and an inner perimeter formed by the plurality of bond pads.

9. The micro electro-mechanical sensor of claim 1, wherein the protective dam is formed as a unit.

10. The micro electro-mechanical sensor of claim 1, wherein the protective dam is line drawn by a dispensing needle.

11. The micro electro-mechanical sensor of claim 1, wherein the protective dam is constructed from silicone material.

12. The micro electro-mechanical sensor of claim 1, wherein the protective dam is constructed from fluorosilicone material.

13. The micro electro-mechanical sensor of claim 1, wherein the protective dam is constructed from fluorocarbon material.

14. The micro electro-mechanical sensor of claim 1, wherein the protective dam is constructed to a height in the range of approximately 258 microns to 1,548 microns.

15. The micro electro-mechanical sensor of claim 1 wherein the protective dam is constructed to a height approximately equal to a loop height of the wire bonds.

16. The micro electro-mechanical sensor of claim 1 wherein the protective dam prevents the encapsulation gel from covering the sensor diaphragm.

17. A micro electro-mechanical system sensor, comprising,
a housing;
a lead frame coupled to the housing;
a sensor die having a first surface for attaching the sensor die to the housing, the sensor die comprising a sensor diaphragm for measuring an ambient condition and a plurality of bond pads formed over a second surface of the sensor die;
wire bonds electrically connecting at least one of the plurality of bond pads to the lead frame;

a protective dam comprising:
- a portion of a cap wafer having at least one aperture for exposing the sensor diaphragm to the ambient condition; and
- a portion of a glass frit pattern for bonding the portion of the cap wafer to the sensor die; and
- encapsulation gel located in a cavity formed by the housing and the protective dam, wherein the encapsulation gel encapsulates the wire bonds but does not encapsulate the sensor diaphragm.

18. The micro electro-mechanical system sensor of claim 17, wherein the sensor die is a sensor die selected from the group consisting of a pressure sensor die for measuring an ambient pressure, a chemical sensor die for measuring an ambient chemical condition, a humidity sensor die for measuring an ambient humidity, and a capacitive device.

19. The micro electro-mechanical system sensor of claim 17, wherein the protective dam is constructed between the perimeter of the sensor diaphragm and an inner perimeter formed by the plurality of wire bond pads.

20. The micro electro-mechanical system sensor of claim 17 wherein the protective dam is constructed from a material selected from the group of materials consisting of silicone, fluorosilicone, and fluorocarbon material.

21. The micro electro-mechanical system sensor of claim 17 wherein the protective dam is constructed to a height approximately equal to a loop height of the wire bonds.

22. A method for selectively encapsulating a micro electro-mechanical system sensor, comprising the steps of:
- attaching a lead frame to a housing;
- attaching a sensor die having bond pads to the housing;
- wire bonding the bond pads of the sensor die to the lead frame;
- constructing a protective dam on a surface of the sensor die; and
- applying an encapsulation gel in a cavity formed by the housing and the protective dam, wherein the encapsulation gel encapsulates the wire bonds but does not encapsulate a sensor diaphragm located on the surface of the sensor die.

23. The method of claim 22, wherein the step of constructing the protective dam further comprises the step of constructing a plurality of protective dam walls.

24. The method of claim 23, wherein the step of constructing the protective dam further comprises the plurality of protective dam walls being constructed as a unit.

25. The method of claim 23, wherein the step of constructing the protective dam further comprises the plurality of protective dam walls being constructed by line drawing each wall of the protective dam.

26. A method for selectively encapsulating a micro electro-mechanical system sensor comprising the steps of:
- attaching a lead frame to a housing;
- attaching a sensor die having wire bond pads to the housing;
- wire bonding the wire bond pads of the sensor die to the lead frame;
- constructing a protective dam on an upper surface of the sensor die; and
- attaching a vent cap to the housing and to the protective dam wherein the vent cap encapsulates the wire bonding and has a vent aperture such that the vent cap does not encapsulate a sensor diaphragm located on the upper surface of the sensor die.

27. The method of claim 26, wherein the step of constructing the protective dam further comprises the step of constructing a plurality of protective dam walls.

28. The method of claim 27, wherein the step of constructing the protective dam further comprises the plurality of protective dam walls being constructed as a unit.

29. The method of claim 27 wherein the step of constructing the protective dam further comprises the plurality of protective dam walls being constructed by line drawing each wall of the protective dam.

30. A method for selectively encapsulating a micro electro-mechanical system sensor comprising the steps of:
- forming a plurality of the sensor devices on a device wafer;
- forming a plurality of diaphragm apertures, device channels and cut lines on a cap wafer;
- forming a glass frit pattern on the cap wafer;
- aligning the cap wafer with the device wafer;
- bonding the cap wafer to the device wafer to form a two wafer combination wherein the two wafer combination is bonded by the glass frit pattern;
- dicing the two wafer combination into a plurality of individual sensor dies wherein each of the plurality of sensor dies is coupled to a protective dam, wherein the protective dam comprises:
  - a portion of the glass frit pattern; and
  - a portion of the cap wafer;
- attaching a lead frame to a housing;
- attaching the sensor die having wire bond pads to the housing;
- wire bonding the wire bond pads of the sensor die to the lead frame; and
- applying an encapsulation gel in a cavity formed by the housing and the protective dam, wherein the encapsulation gel encapsulates the wire bonding but does not encapsulate a sensor diaphragm located on an upper surface of the sensor die.

* * * * *